United States Patent
Xie et al.

(10) Patent No.: US 10,236,218 B1
(45) Date of Patent: Mar. 19, 2019

(54) METHODS, APPARATUS AND SYSTEM FOR FORMING WRAP-AROUND CONTACT WITH DUAL SILICIDE

(71) Applicant: GLOBALFOUNDRIES, INC., Grand Cayman (KY)

(72) Inventors: Ruilong Xie, Niskayuna, NY (US); Julien Frougier, Albany, NY (US); Hiroaki Niimi, Cohoes, NY (US); Nigel Cave, Saratoga Springs, NY (US); Xusheng Kevin Wu, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/900,264

(22) Filed: Feb. 20, 2018

(51) Int. Cl.
*H01L 21/8238* (2006.01)
*H01L 27/092* (2006.01)
*H01L 29/66* (2006.01)
*H01L 21/02* (2006.01)
*H01L 21/3213* (2006.01)

(52) U.S. Cl.
CPC ........ *H01L 21/823835* (2013.01); *H01L 21/02532* (2013.01); *H01L 21/32139* (2013.01); *H01L 21/823821* (2013.01); *H01L 27/0924* (2013.01); *H01L 29/66545* (2013.01)

(58) Field of Classification Search
IPC ........... H01L 21/823835,21/02532, 21/32139, 21/823821, 27/0924, 29/66545
See application file for complete search history.

(56) References Cited

U.S. PATENT DOCUMENTS 10,074,558 B1 * 9/2018 Tsai ............... H01L 21/7682

* cited by examiner

*Primary Examiner* — Hrayr A Sayadian
(74) *Attorney, Agent, or Firm* — William Morgan, P.C.

(57) ABSTRACT

At least one method, apparatus and system disclosed herein involves forming semiconductor devices comprising dual silicides in contacts to FinFETs. The semiconductor device may comprise a PFET fin; an NFET fin; a first metal silicide around the NFET fin; a second metal silicide around the PFET fin; and a fill metal around the second metal silicide, above the PFET fin, and above the NFET fin. Methods of forming such devices are also disclosed.

15 Claims, 15 Drawing Sheets

METHODS, APPARATUS AND SYSTEM FOR FORMING WRAP-AROUND CONTACT WITH DUAL SILICIDE

BACKGROUND OF THE INVENTION

Field of the Invention

Generally, the present disclosure relates to the manufacture of sophisticated semiconductor devices, and more specifically, to various methods for forming wrap-around contacts with dual silicide.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits.

FinFET designs use "fins" that may be formed on the surface of a semiconductor wafer using selective-etching processes. The fins may be used to form a raised channel between the gate and the source and drain of a transistor. FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. The interest in finFETs has driven related interest in the formation of electrical contacts to finFETs. However, the forming of FinFETs requires optimization of numerous parameters, including parameters related to contact formation. For example, optimizing the performance of PFET fins and NFET fins may suggest including a first metal silicide in contacts to epitaxial source/drain (S/D) regions of the NFET fins and including a second metal silicide in contacts to epitaxial S/D regions of the PFET fins. However, challenges exist in reducing or preventing the presence of the second metal silicide in contacts to NFET S/D regions and/or the presence of the first metal silicide in contacts to PFET S/D regions.

The present disclosure may provide finFETs minimizing or overcoming one or more of the challenges discussed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and system for forming a semiconductor device containing a PFET fin; an NFET fin; a first metal silicide around the NFET fin; a second metal silicide around the PFET fin; and a fill metal around the second metal silicide, above the PFET fin, and above the NFET fin.

BRIEF DESCRIPTION OF THE DRAWINGS

The disclosure may be understood by reference to the following description taken in conjunction with the accompanying drawings, in which like reference numerals identify like elements, and in which.

Figure 1:
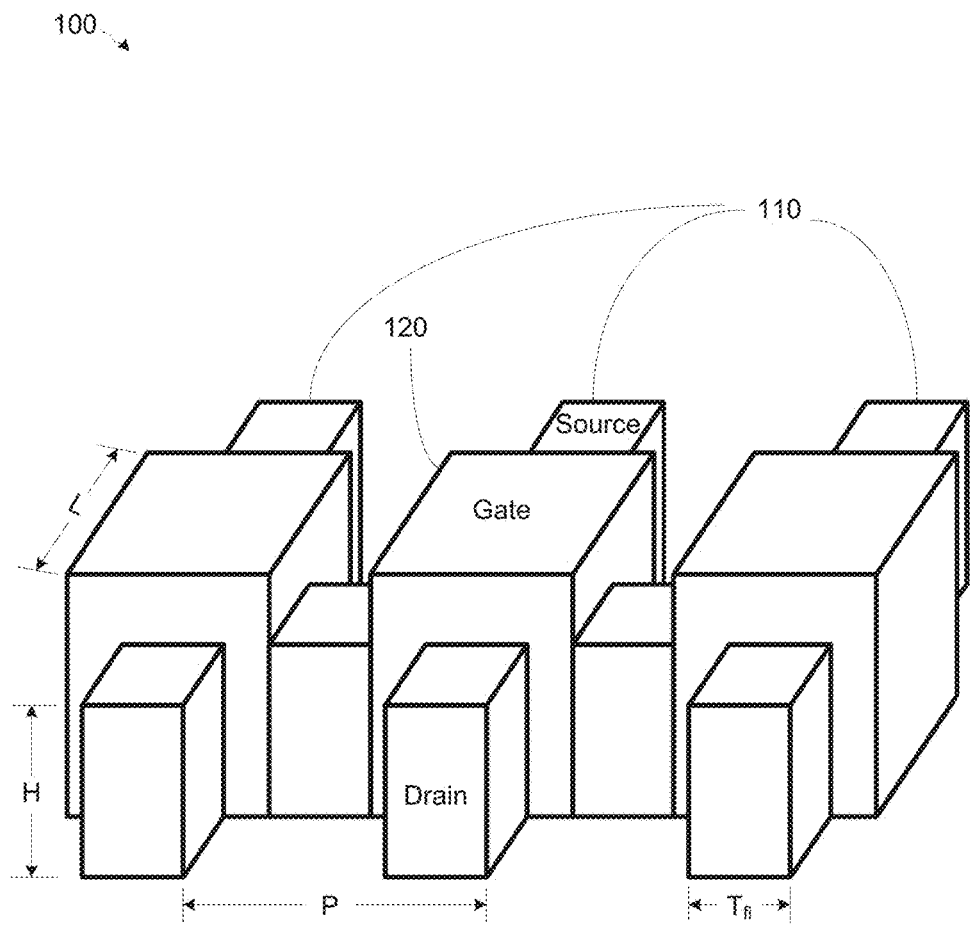
FIG. 1 illustrates a stylized cross-sectional depiction of a state-of-the-art semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein for performing one or more process operations to form semiconductor devices comprising two silicides in FinFET contact formation, one silicide being suitable for forming contacts to epitaxial S/D regions of NFET fins and the other silicide being suitable for forming contacts to epitaxial S/D regions of PFET fins. The process operations described herein may yield PFET fins and NFET fins having high performance.

Figure 2:
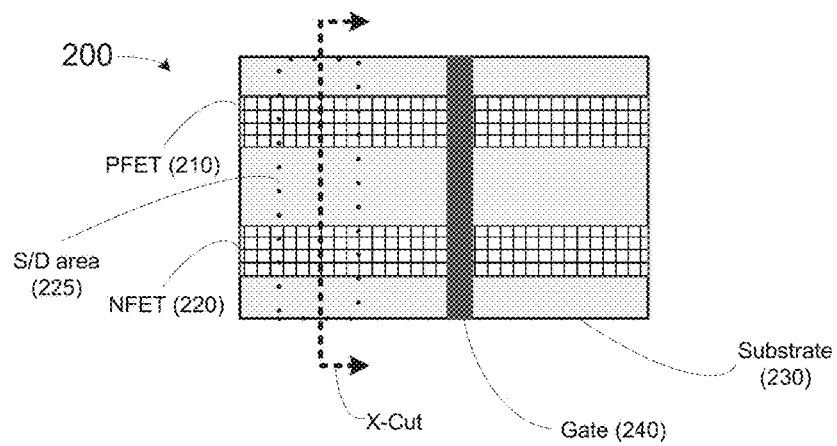
FIG. 2 illustrates a stylized plan or top-view depiction of a semiconductor device with an X-cut line of view indicated, in accordance with embodiments herein.

FIG. 2 illustrates a stylized plan or top-view depiction of a semiconductor device 200 in accordance with embodiments herein. The semiconductor device 200 comprises a substrate 230, on which are formed a PFET fin 210 and an NFET fin 220. A gate 240 is formed over the PFET fin 210 and the NFET fin 220. The gate 240 has a long axis perpendicular to the long axes of the PFET fin 210 and the NFET fin 220.

A portion of both the PFET fin 210 and the NFET fin 220 is a source/drain (S/D) area 225, in which portions of the PFET fin 210 and/or the NFET fin 220 may be recessed and in which S/D regions may be formed. S/D regions formed in the S/D area 225 may comprise epitaxial silicon and/or epitaxial SiGe, each with or without a dopant for PFET or NFET use, as appropriate.

Subsequent stylized cross-sectional depictions of the semiconductor device according to embodiments herein will be taken along an X-cut through and perpendicular to the long axes of the PFET fin 210 and the NFET fin 220. The X-cut is taken through a section of the fins on which source/drain regions will subsequently be formed, as described below.

For brevity, the figures depict FinFET devices comprising one NFET fin and one PFET fin. The disclosure is also applicable to other FinFET structures, such as devices with a plurality of PFET fins and/or a plurality of NFET fins. Further, the disclosure is also applicable to non-finFET structures, such as nanosheet devices, nanowire devices, and planar FETs, among others.

Figure 3:
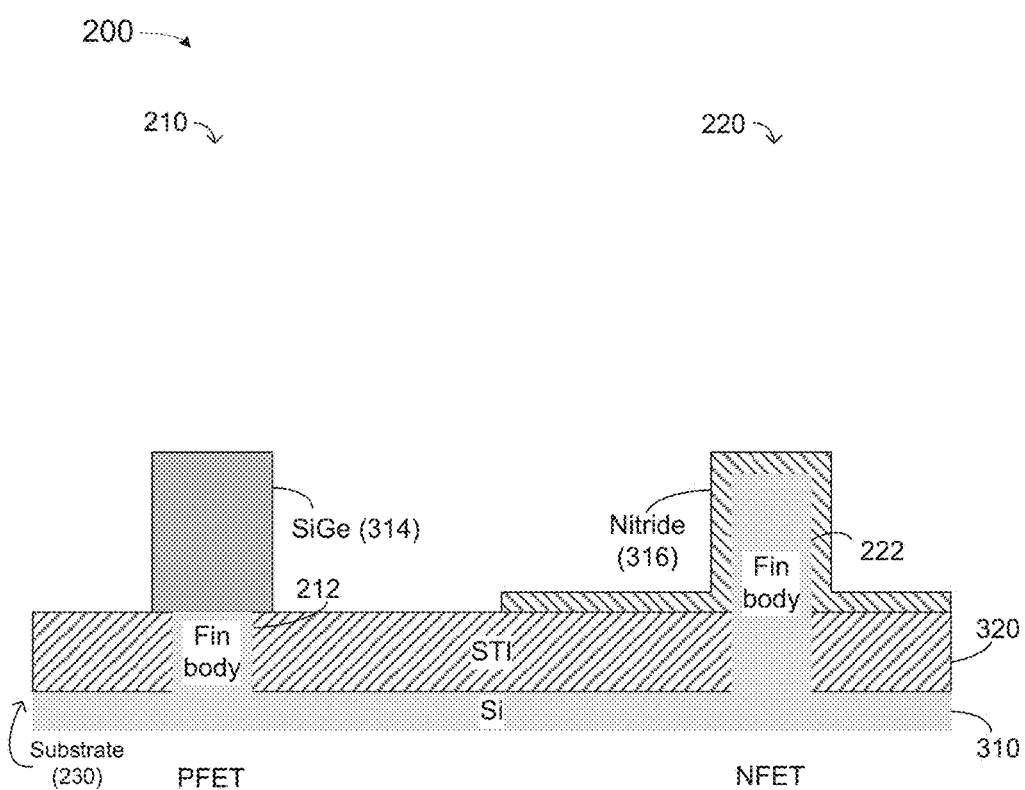
FIG. 3 illustrates a stylized depiction of an X-cut cross-section view of a semiconductor device, with respect to forming a PFET fin and an NFET fin, in accordance with embodiments herein.

Turning now to FIG. 3, a stylized depiction of an X-cut cross-section view of the semiconductor device 200 with respect to a first stage of manufacture thereof and in accordance with embodiments herein is illustrated. In the depicted embodiment, the substrate 230 comprises a silicon layer 310, from which a PFET fin body 212 and an NFET fin body 222 have been formed, and on which a shallow trench isolation (STI) 320 has been formed between and around fin bodies 212 and 222. The silicon layer 310 may contain bulk silicon. The silicon layer 310 may be substituted by any semiconducting layer known to the person of ordinary skill in the art as a routine matter to those having the benefit of the present disclosure. The STI 320 may contain silicon oxide. The STI 320 provides electrical isolation of structures formed on the substrate. The STI 320 may be substituted by electrically isolating materials known to the person of ordinary skill in the art as a routine matter to those having the benefit of the present disclosure. A FinFET device according to this embodiment may be termed a bulk FinFET device.

In other embodiments (not shown), the substrate 230 may comprise a silicon layer 310 and a silicon oxide layer disposed on the silicon layer 310. In this embodiment, the fin bodies 212, 222 are formed by deposition of fin body material on the silicon oxide layer. A device according to this embodiment may be termed a silicon-on-insulator (SOI) FinFET device An SOI FinFET device may be implemented as a routine matter by the person of ordinary skill in the art having the benefit of the present disclosure.

In the depicted embodiment, the PFET fin 210 and the NFET fin 220 are formed from a fin body, e.g., PFET fin body 212 and NFET fin body 222. The fin body may comprise a single block of material or may comprise a plurality of layers. The latter fin body structure may be termed a "nanosheet" or "nanowire" structure. Herein, the term "fin" will be used to refer to structures containing either fin body structure. In embodiments wherein the fin bodies 212 and 222 comprise nanosheet structures, the fin bodies 212 and 222 may each have a structure disclosed by and formed according to methods disclosed by U.S. Pat. No. 9,748,335, issued on Aug. 29, 2017, assigned to GLOBALFOUNDRIES INC., and incorporated herein by reference.

At the stage of manufacture depicted in FIG. 3, the PFET fin 210 comprises a silicon-germanium (SiGe) region 314 formed after recessing the fin body 212 in the S/D area 225 to the height of the STI 320. The SiGe region 314 may comprise epitaxial SiGe. In one embodiment, the SiGe region 314 may be doped, e.g., with boron, gallium, indium, any other dopant known to the person of ordinary skill in the art for use in PFET fins, or two or more thereof. The SiGe region 314 may provide a source/drain (S/D) region for the PFET fin 210.

Although FIG. 3 shows SiGe region 314 as having a rectangular cross-section, in other embodiments, SiGe region 314 may have a diamond-shaped cross-section or any other shape of cross-section known to the person of ordinary skill in the art for epitaxially grown materials.

The NFET fin 220 lacks any SiGe region 314 at this stage of manufacture. However, as depicted, the NFET fin 230 may be covered at this stage of manufacture by a nitride layer 316, such as a silicon nitride layer.

Figure 4:
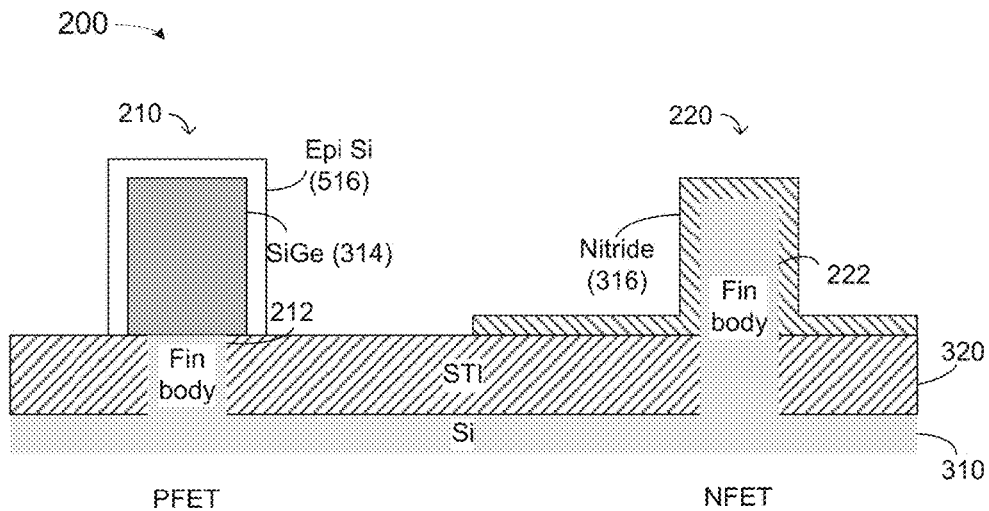
FIG. 4 illustrates a stylized depiction of an X-cut cross-section view of the semiconductor device of FIG. 3, with respect to protecting an NFET fin, in accordance with embodiments herein.

Turning now to FIG. 4, a stylized X-cut cross-sectional view of the semiconductor device 200 with respect to an epitaxial silicon formation process is depicted in accordance with embodiments herein. An epitaxial silicon layer 516 is formed over the sides and top of SiGe region 314. Formation of the epitaxial silicon layer 516 may be performed as a routine matter by the person of ordinary skill in the art having the benefit of the present disclosure. The presence of the nitride 316 prevents formation of the epitaxial silicon layer 516 over the NFET fin 220.

Figure 5:
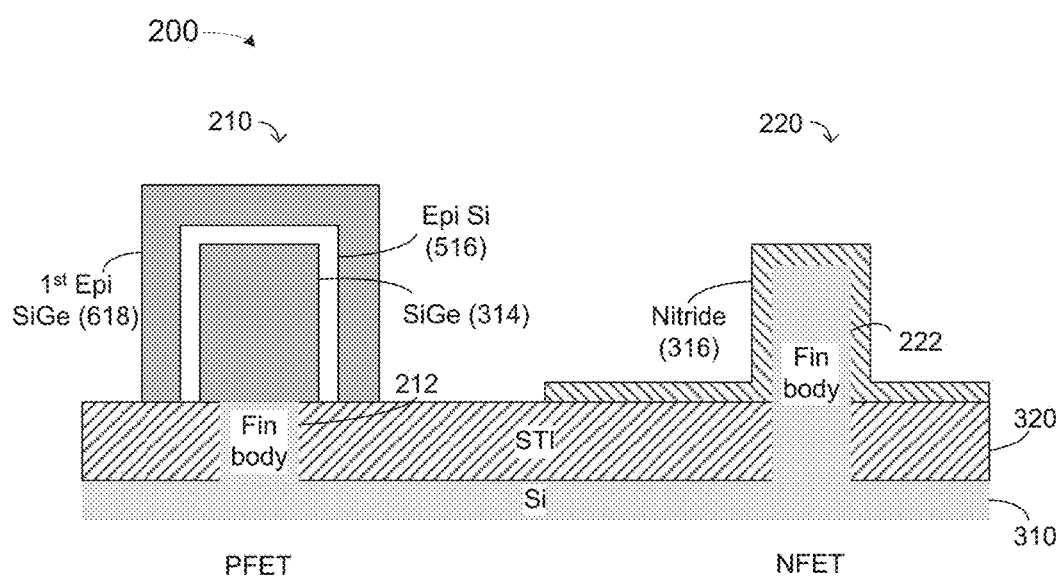
FIG. 5 illustrates a stylized X-cut cross-sectional view of the semiconductor device of FIG. 4, with respect to an epitaxial silicon layer formation process, in accordance with embodiments herein.

FIG. 5 illustrates a stylized X-cut cross-sectional view of the semiconductor device 200 with respect to an epitaxial SiGe formation process in accordance with embodiments herein. A first epitaxial SiGe layer 618 is formed over the sides and top of the epitaxial silicon layer 516. The first epitaxial SiGe layer 618 formed on the sides of the PFET fin 210 will have an initial thickness.

Formation of the first epitaxial SiGe layer 618 may be performed as a routine matter by the person of ordinary skill in the art having the benefit of the present disclosure. The presence of the nitride 316 prevents formation of first epitaxial SiGe layer 618 over the NFET fin 220.

Figure 6:
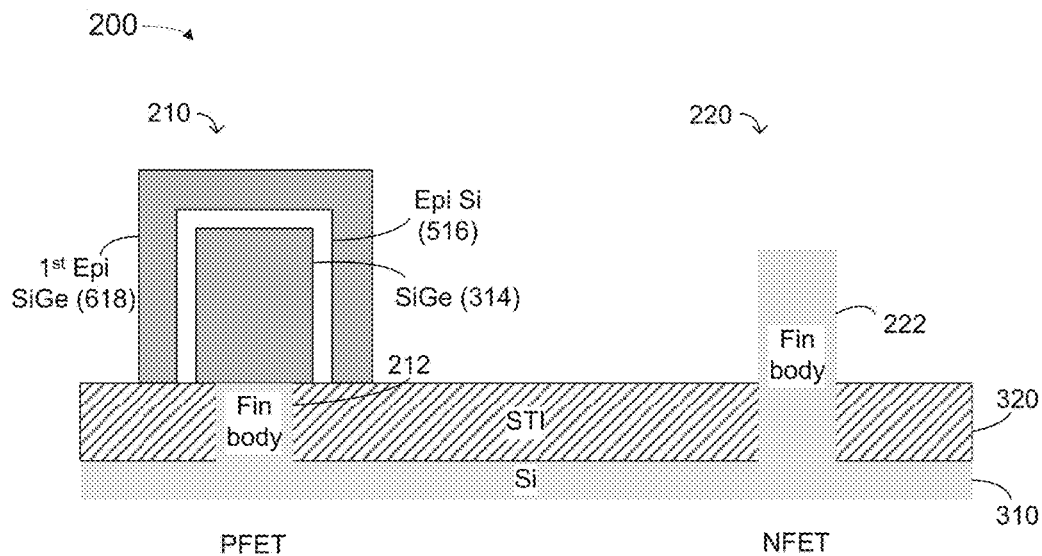
FIG. 6 illustrates a stylized X-cut cross-sectional view of the semiconductor device of FIG. 5, with respect to a first epitaxial silicon-germanium (SiGe) layer formation process, in accordance with embodiments herein.

FIG. 6 illustrates a stylized X-cut cross-sectional view of the semiconductor device 200 with respect to a nitride removal process in accordance with embodiments herein. The nitride 316 may be removed from over the NFET fin 220 by any appropriate technique.

Figure 7:
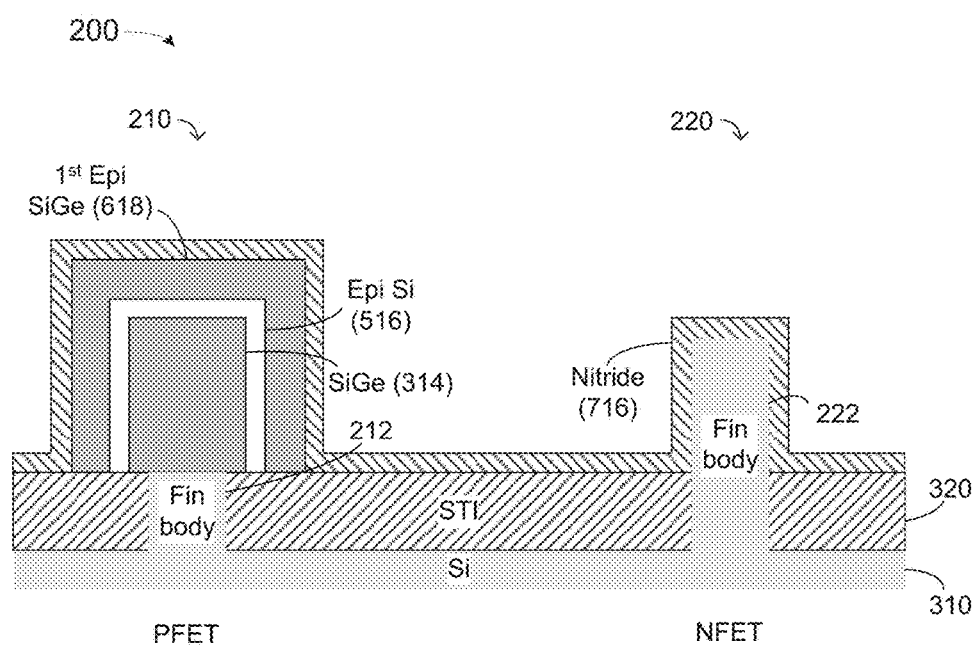
FIG. 7 illustrates a stylized X-cut cross-sectional view of the semiconductor device of FIG. 6, with respect to protecting a PFET fin, in accordance with embodiments herein.

FIG. 7 illustrates a stylized X-cut cross-sectional view of the semiconductor device 200 with respect to a nitride deposition process in accordance with embodiments herein. A nitride 716, which may be a silicon nitride, is deposited to have a uniform thickness over the PFET fin 210 and the NFET fin 220. Nitride deposition techniques are known to the person of ordinary skill in the art and need not be discussed further.

Figure 8:
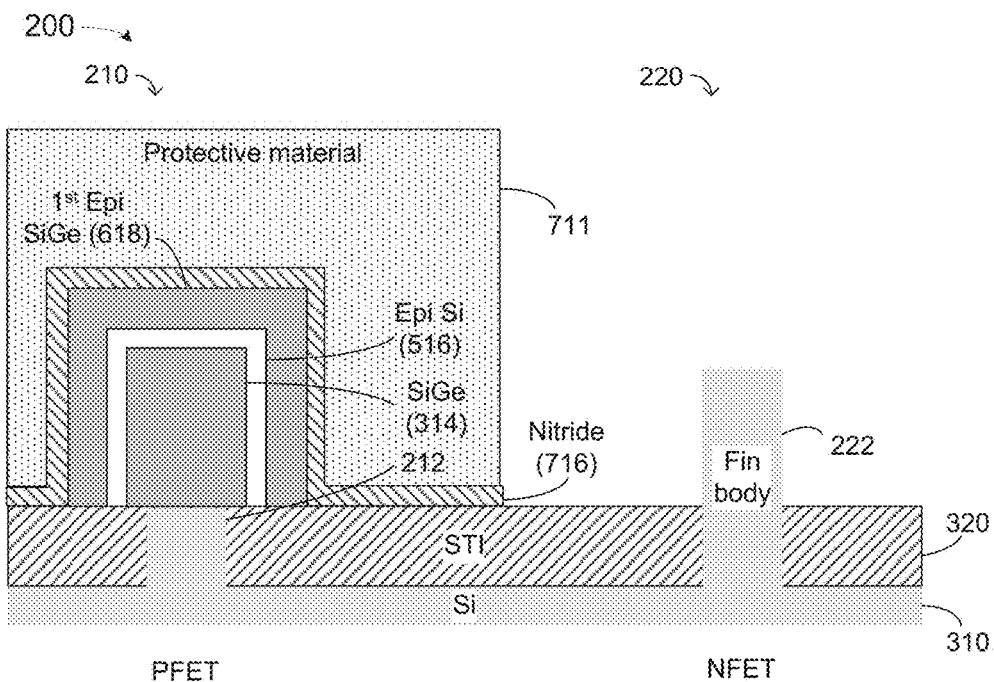
FIG. 8 illustrates a stylized X-cut cross-sectional view of the semiconductor device of FIG. 7, with respect to a silicon layer formation process, in accordance with embodiments herein.

FIG. 8 illustrates a stylized X-cut cross-sectional view of the semiconductor device 200 with respect to a nitride removal process and a protective material depositon process in accordance with embodiments herein. The nitride 716 may be removed from over the NFET fin 220 by any appropriate technique. A protective material 711 may be formed over the PFET fin 210. The order in which the nitride 716 is removed and the protective material 711 is formed is not crucial, i.e., removal and formation may be performed in either order.

In one embodiment, the protective material 711 may be an organic polymerization layer (OPL).

The absence of the nitride 716 over the NFET fin 220 and the presence of the protective material 711 over the PFET fin 210 will allow subsequent process steps to be performed solely on the NFET fin 220.

Figure 9:
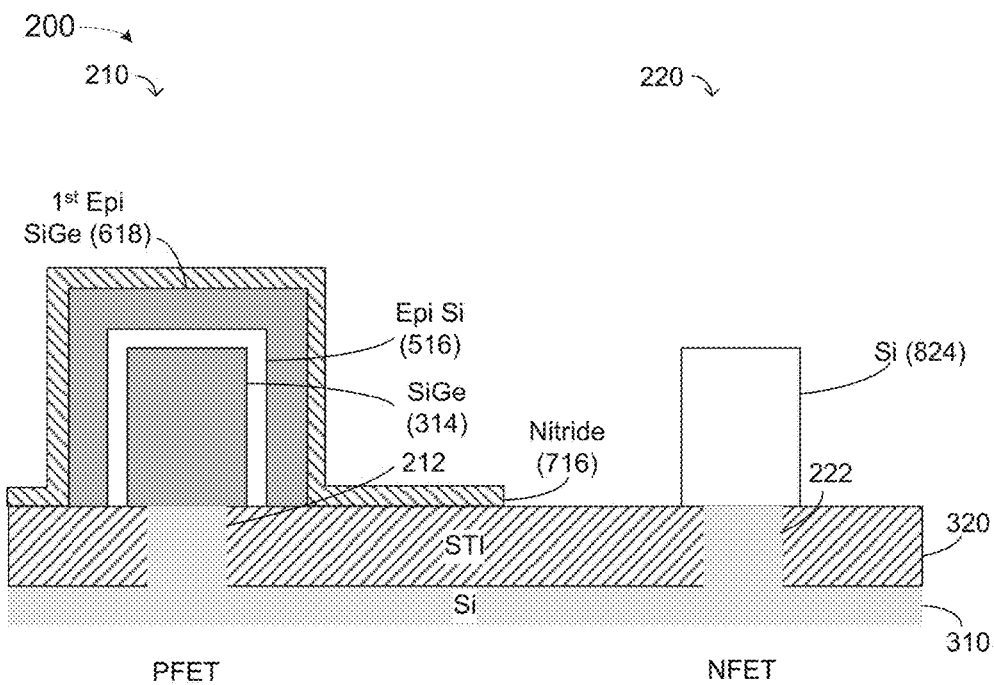
FIG. 9 illustrates a stylized X-cut cross-sectional view of the semiconductor device FIG. 8, with respect to deprotecting a PFET fin, in accordance with embodiments herein.

FIG. 9 illustrates a stylized X-cut cross-sectional view of the semiconductor device 200 with respect to a silicon formation process and a protective material removal process in accordance with embodiments herein. A silicon region 824 is formed in a recess formed within the NFET fin 220 in the S/D area 225. Techniques for recessing the NFET fin 220 will be known to the person of ordinary skill in the art and need not be described further. The silicon region 824 may be formed by epitaxial growth of silicon. In one embodiment, the silicon region 824 may be doped, such as with phosphorous, arsenic, antimony, any other dopant known to the person of ordinary skill in the art for use in NFET fins, or two or more thereof. The silicon region 824 may provide a S/D region for the NFET fin 220. Formation of the silicon region 824 may be performed as a routine matter by the person of ordinary skill in the art having the benefit of the present disclosure.

Similarly to the SiGe region 314, the silicon region 824 need not have the depicted rectangular cross-section, but may have a diamond-shaped cross-section or any other shape of cross-section of an epitaxial material known by the person of ordinary skill in the art.

Figure 10:
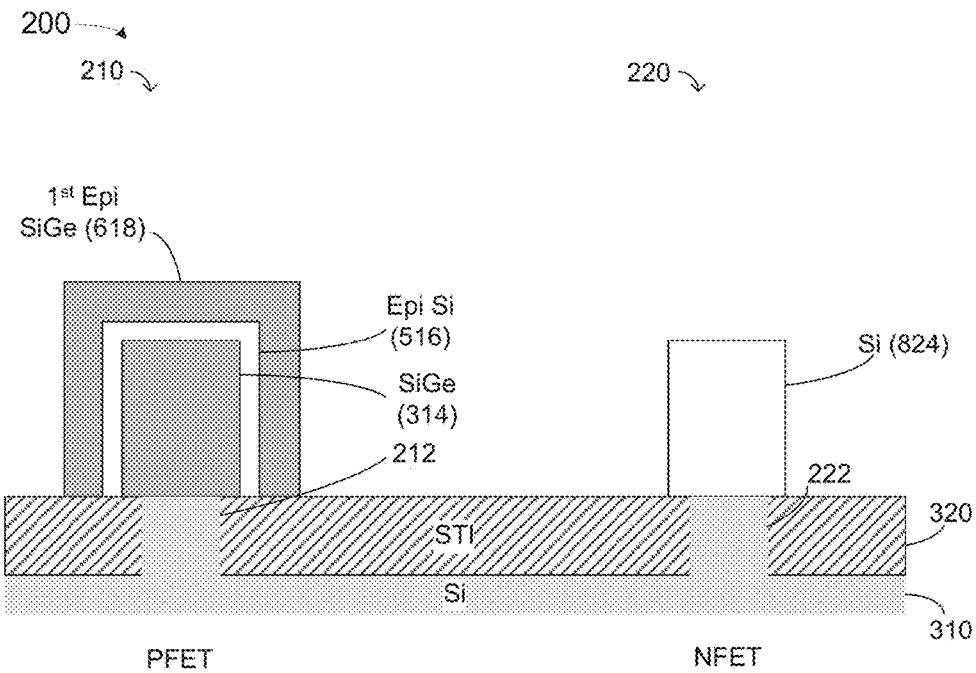
FIG. 10 illustrates a stylized depiction of an X-cut cross-section view of the semiconductor device of FIG. 9, with respect to adding SiGe to thicken a first epitaxial SiGe layer on a PFET fin and form a second epitaxial SiGe layer on an NFET fin, in accordance with embodiments herein.

After formation of the silicon region 824. the protective material 711 is removed. For example, when the protective material 711 is an OPL material, the protective material 711 may be removed by ashing. Techniques for removal of protective materials are known to the person of ordinary skill in the art and need not be described in detail. FIG. 10 presents a stylized depiction of an X-cut cross-section view of the semiconductor device 200 with respect to a process of removing nitride in accordance with embodiments herein. The nitride 716 may be removed from over the PFET fin 210 by any appropriate technique.

Removal of the protective material 711 and the nitride 716 allows subsequent process steps to be performed on both the PFET fin 210 and the NFET fin 220.

Figure 11:
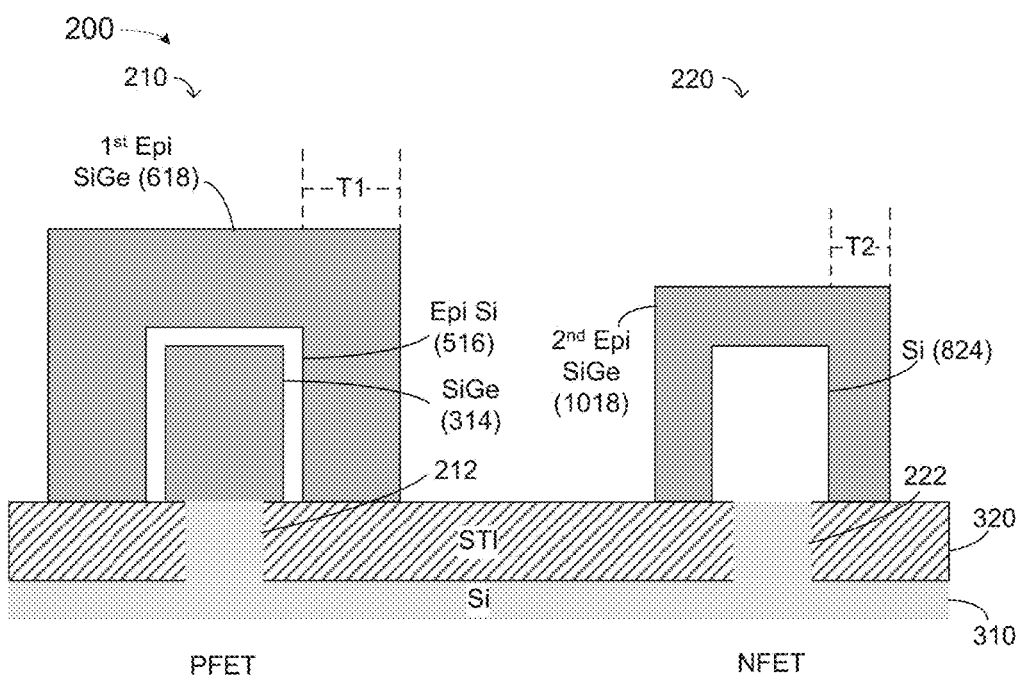
FIG. 11 illustrates a stylized depiction of an X-cut cross-section view of the semiconductor device of FIG. 10, with respect to forming an interlayer dielectric (ILD), in accordance with embodiments herein.

Turning now to FIG. 11, a stylized depiction of an X-cut cross-section view of the semiconductor device 200 with respect to a process of adding epitaxial SiGe is illustrated in accordance with embodiments herein. Epitaxial SiGe is grown over the first epitaxial SiGe layer 618 on the PFET fin 210 and over the silicon region 824 on the NFET fin 220. Adding epitaxial SiGe over the PFET fin 210 increases the thickness of the first epitaxial SiGe layer 618 on the sides of the fin body 212. The thickness of the first epitaxial SiGe layer 618 on the sides of the PFET fin 210 after adding epitaxial SiGe is indicated as T1.

Adding epitaxial SiGe over the NFET fin 220 forms a second epitaxial SiGe layer 1018 over the NFET fin 220, specifically, on the sides and top of the silicon region 824. The thickness of the second epitaxial SiGe layer 1018 on the sides of the NFET fine 220 after adding epitaxial SiGe is indicated as T2. Because the first epitaxial SiGe layer 618 was present previously, and substantially the same thickness of epitaxial SiGe was added over both fins 210, 220, the thickness T1 on the PFET fin 210 is greater than the thickness T2 on the NFET fin 220. FIG. 11 represents this relationship qualitatively, i.e., T1 and T2 in FIG. 10 are not to scale.

Figure 12:
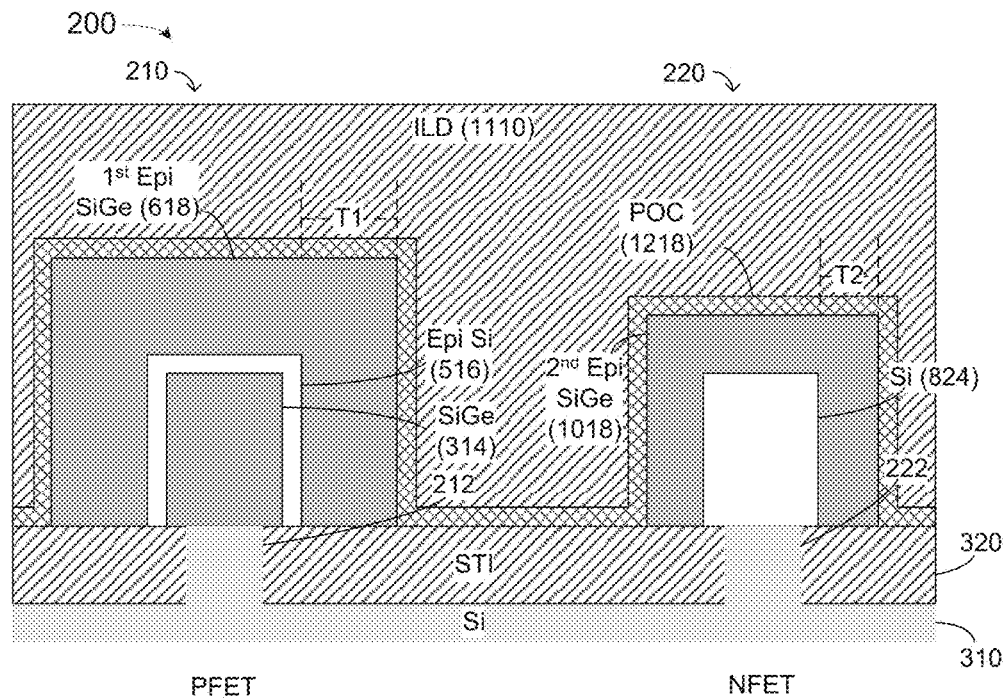
FIG. 12 illustrates a stylized X-cut cross-sectional view of the semiconductor device of FIG. 11, with respect to a trench formation process, in accordance with embodiments herein.

Turning now to FIG. 12, a stylized depiction of an X-cut cross-section view of the semiconductor device 200 with respect to the formation of a poly-open chemical-mechanical polishing (POC) liner and an interlayer dielectric (ILD) in accordance with embodiments herein is illustrated. A POC liner 1218 is deposited over the semiconductor device 200, including the PFET fin 210 and the NFET fin 220. An ILD 1110 is deposited over the semiconductor device 200, including the PFET fin 210 and the NFET fin 220. Any appropriate material may be used as the ILD 1110. In one embodiment, the ILD 1110 comprises $SiO_2$. The ILD 1110 may be deposited using any appropriate technique known to the person of ordinary skill in the art having the benefit of the present disclosure.

Formation of the ILD 1110 may involve deposition of an excess of ILD material, followed by chemical-mechanical polishing (CMP) of the ILD material to lower the top of the ILD 1110 to a desired height above the substrate 230.

If the gate 240 (depicted in FIG. 2) is formed by a replacement metal gate (RMG) process, the RMG process may be performed after depositing the ILD 1110.

Figure 13:
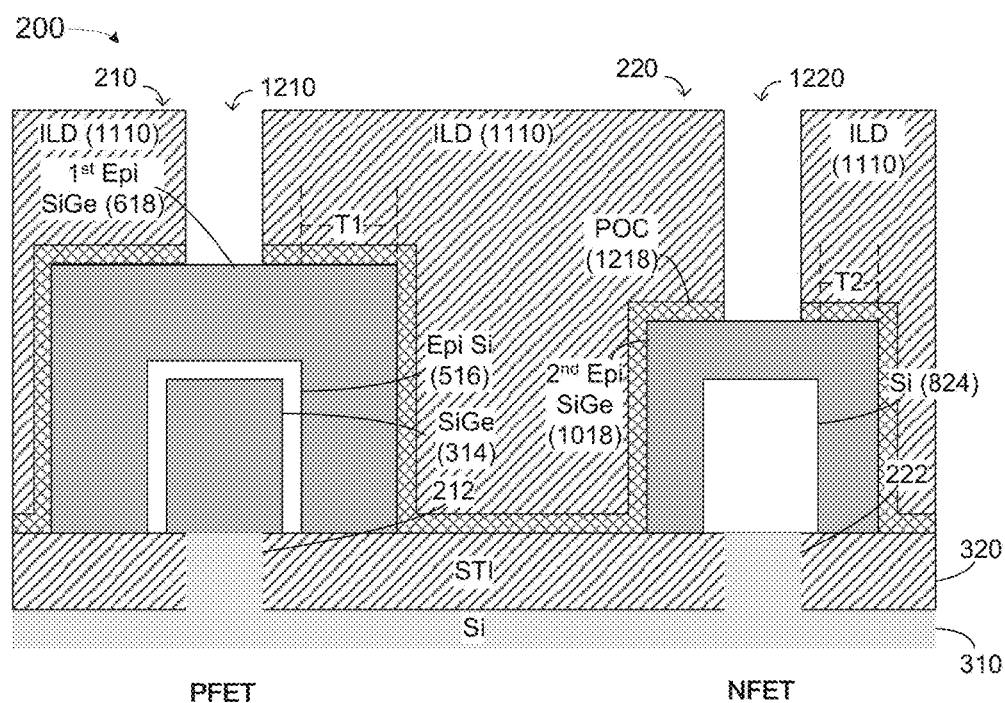
FIG. 13 a stylized X-cut cross-sectional view of the semiconductor device of FIG. 12, with respect to an epitaxial SiGe removal process, in accordance with embodiments herein.

Turning now to FIG. 13, a stylized X-cut cross-sectional view of the semiconductor device 200 with respect to a trench formation process in accordance with embodiments herein is illustrated. A trench 1210 is formed over the PFET fin body 212 and a trench 1220 is formed over the NFET fin body 222. The width of each trench 1210 and 1220 may be less than that of the corresponding fin body 212 or 222. Trenches 1210 and 1220 may be formed by any appropriate technique known to the person of ordinary skill in the art. In one embodiment, trenches 1210 and 1220 are formed by a reactive ion etch (ME) technique under conditions which remove portions of the ILD 1110 and portions of the POC liner 1218 and which do not remove any portion of first epitaxial SiGe layer 618 and second epitaxial SiGe layer 1018.

Figure 14:
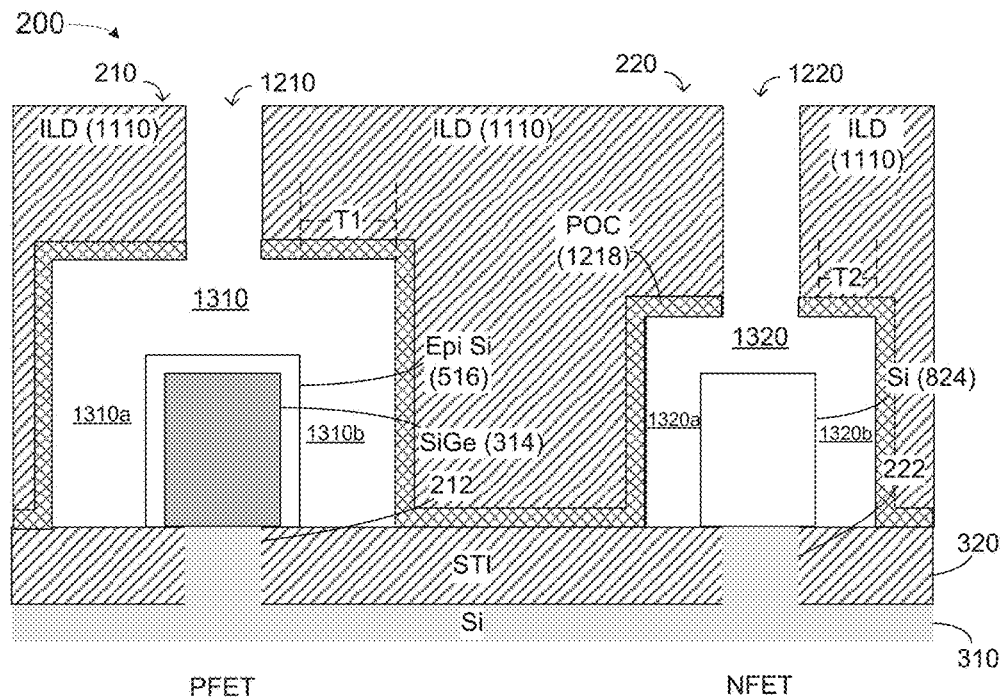
FIG. 14 illustrates a stylized X-cut cross-sectional view of the semiconductor device of FIG. 13, with respect to silicon removal/thinning process, in accordance with embodiments herein.

FIG. 14 illustrates a stylized X-cut cross-sectional view of the semiconductor device 200, with respect to an epitaxial SiGe removal process in accordance with embodiments herein. The semiconductor device 200 is exposed to conditions and reactants which are selective for SiGe while leaving silicon, e.g., the epitaxial silicon layer 516 on the PFET fin 210 and the silicon 824 on the NFET fin 220. Such conditions and reactants are known to the person of ordinary skill in the art and need not be described further.

Epitaxial SiGe removal yields a first cavity 1310 around the PFET fin 210 and a second cavity 1320 around the NFET fin 220. The first cavity 1310 may be considered to have two vertically-extending portions 1310a and 1310b, wherein each of 1310a and 1310b is laterally disposed between the epitaxial silicon layer 516 and the POC liner 1218. Similarly, the second cavity 1320 may be considered to have two vertically-extending portions 1320a and 1320b, wherein each of 1320a and 1320b is laterally disposed between the silicon region 824 and the POC liner 1218. The width of vertically-extending portion 1310b of the first cavity 1310 (T1) is greater than the width of vertically-extending portion 1320b of the second cavity 1320 (T2). The same relation holds true for the vertically-extending portions 1310a and 1320a.

Figure 15:
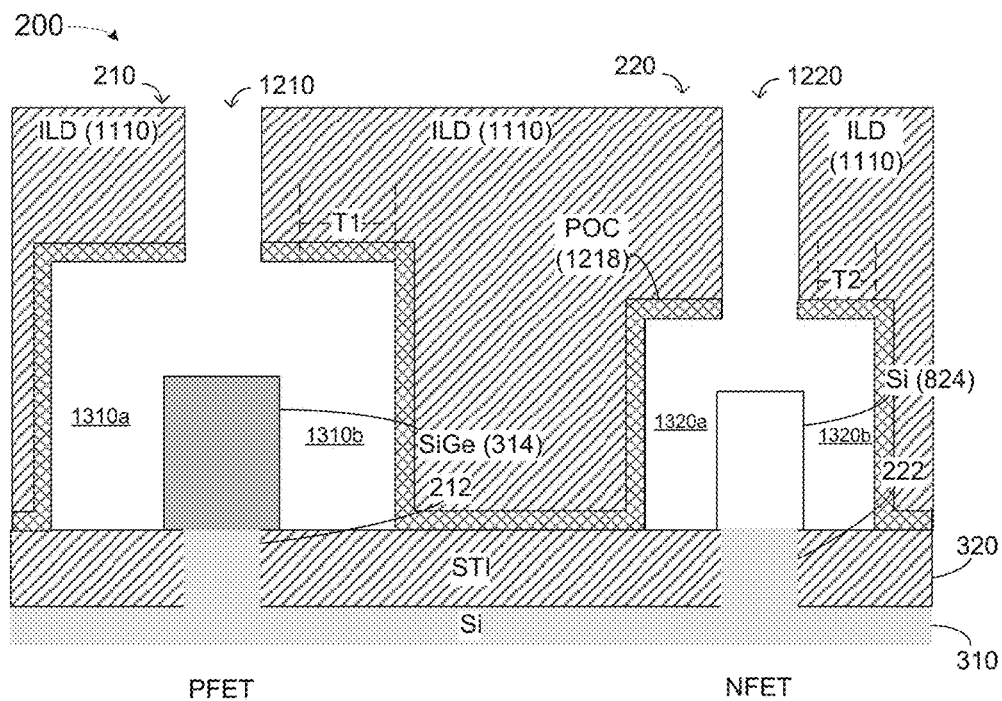
FIG. 15 illustrates a stylized X-cut cross-sectional view of the semiconductor device of FIG. 14, with respect to a first metal deposition process, in accordance with embodiments herein.

FIG. 15 illustrates a stylized cross-sectional view of the semiconductor device 200, with respect to an epitaxial silicon layer removal process, in accordance with embodiments herein. In some embodiments, the epitaxial silicon layer 516 may be removed from the PFET fin 210 by any desired technique. Generally, removing the epitaxial silicon layer 516 will simultaneously thin the silicon region 824 on the NFET fin 220. The removal of the epitaxial silicon layer 516 and the thinning of the silicon region 824 will generally increase the width of cavity portions 1310a, 1310b, 1320a, and 1320b by similar amounts. Accordingly, the width of e.g. first cavity portion 1310b will remain greater than the width of second cavity portion 1320b after epitaxial silicon removal.

Figure 16:
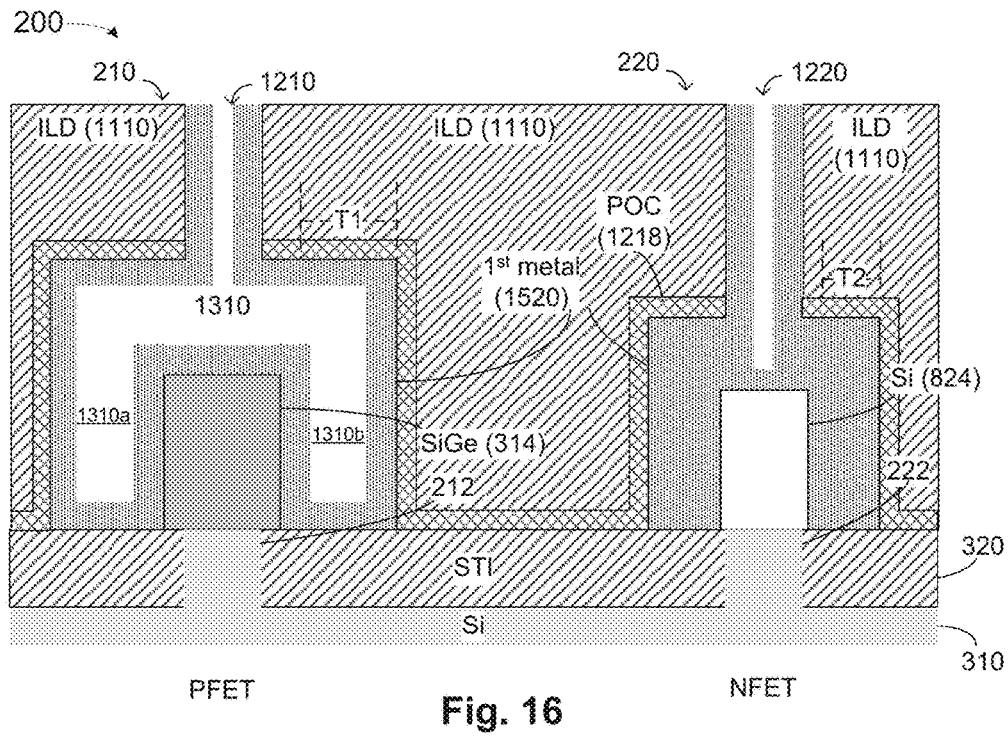
FIG. 16 illustrates a stylized X-cut cross-sectional view of the semiconductor device of FIG. 15, with respect to an isotropic first metal removal process, in accordance with embodiments herein.

FIG. 16 illustrates a stylized X-cut cross-sectional view of the semiconductor device 200 with respect to a first metal deposition process in accordance with embodiments herein. A first metal 1520, which may be titanium or another metal of which the silicide thereof is suitable for wrapping a S/D region (e.g., silicon region 824) disposed within an NFET fin 220 in a final semiconductor device 200, may be deposited within each of the cavities 1310 and 1320, and each of the trenches 1210 and 1220. Because the width of the first cavity portions 1310a and 1310b is greater than the width of the second cavity portions 1320a and 1320b, deposition of the first metal 1520 may be performed for a duration and under other conditions to completely fill the second cavity 1320 while only partially filling the first cavity 1310 and the trenches 1210 and 1220. The second cavity 1320 may be said to be "pinched-off" by the first metal 1520. The duration and other process conditions required may be routinely determined by the person of ordinary skill in the art having the benefit of the present disclosure.

After deposition of the first metal, either of two process flows may be followed. The first will be depicted in FIGS. 17-19. The second will be depicted in FIGS. 20-25.

Figure 17:
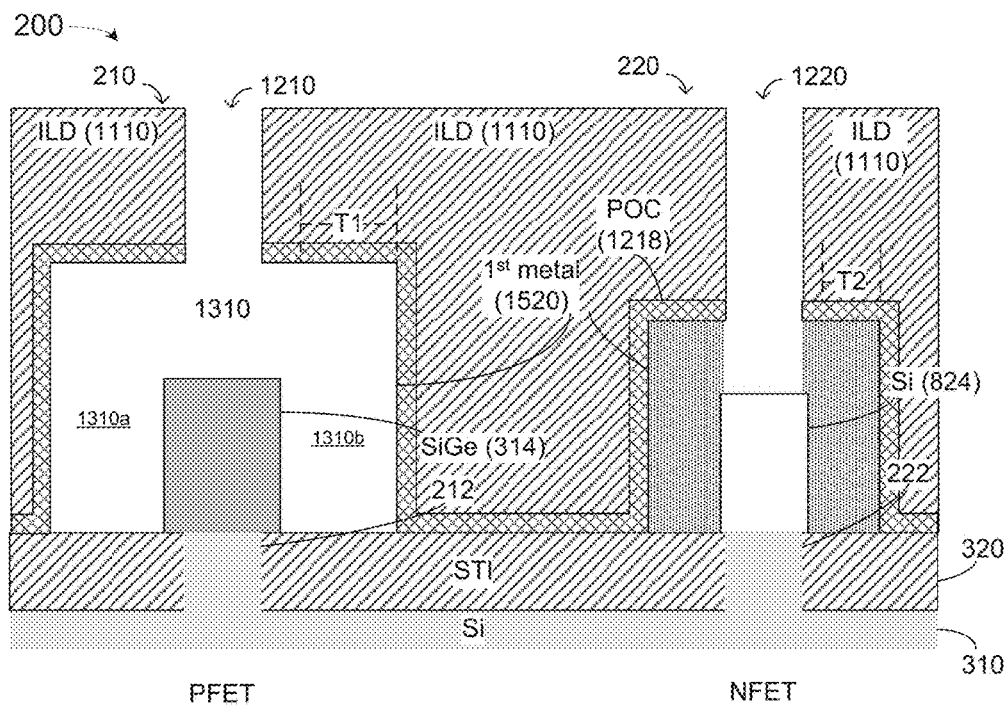
FIG. 17 illustrates a stylized X-cut cross-sectional view of the semiconductor device of FIG. 16, with respect to a second metal deposition process, in accordance with embodiments herein.

FIG. 17 illustrates a stylized X-cut cross-sectional view of the semiconductor device 200 after an isotropic first metal removal process, in accordance with embodiments herein. The isotropic removal of the first metal 1520 may be performed using any appropriate technique known to the person of ordinary skill in the art. Isotropic removal of the first metal 1520 is performed for a duration and under conditions such that the first metal 1520 is completely removed from the first trench 1210, the second trench 1220, and the first cavity 1310, but is substantially retained in the second cavity 1320, such that the vertically-extending portions 1320a and 1320b of the second cavity 1320 remain substantially filled with the first metal 1320 throughout their entire height.

Figure 18:
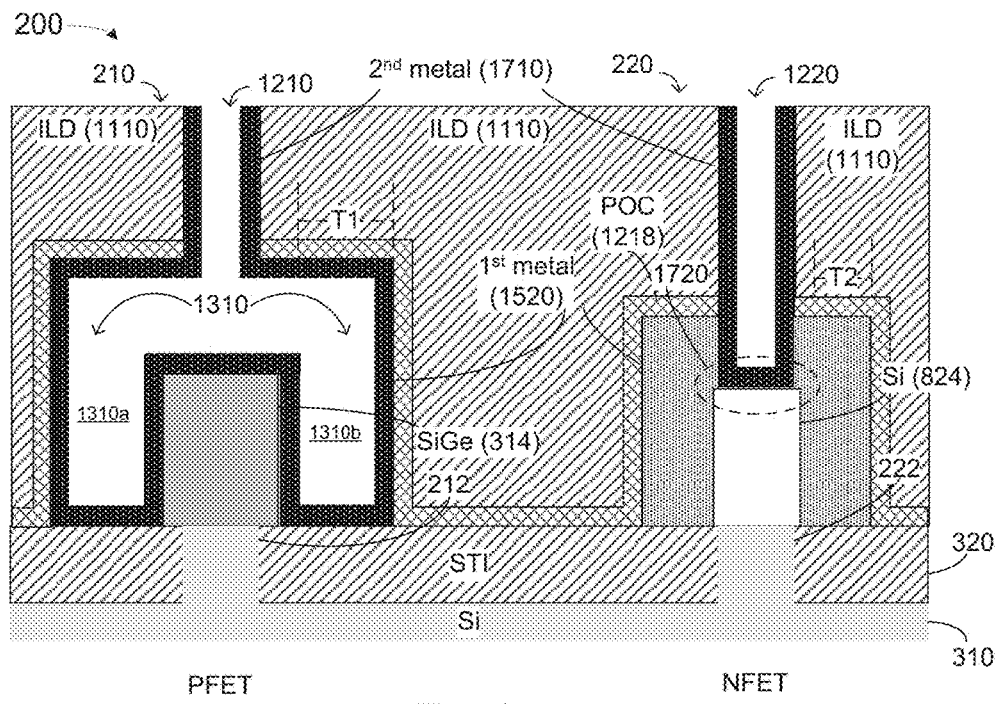
FIG. 18 illustrates a stylized X-cut cross-sectional view of the semiconductor device of FIG. 17, with respect to a fill metal deposition process, in accordance with embodiments herein.

Turning now to FIG. 18, a stylized X-cut cross-sectional view of the semiconductor device 200 after a second metal deposition process in accordance with embodiments herein is depicted. A second metal 1710 is deposited on the walls of the first trench 1210, the walls of the second trench 1220, the surfaces of the first cavity 1310, and the surfaces of the second cavity 1320. The second metal 1710 may comprise nickel, nickel-platinum, or any other metal of which the silicide thereof is suitable for wrapping a S/D region, such as the SiGe region 314, disposed within a PFET fin 210 in a final semiconductor device 200. The second metal 1710 may be deposited using any technique known to the person of ordinary skill in the art.

Although the second metal 1710 is deposited in surfaces of the second cavity 1320, in proximity to the NFET fin 220, and a silicide of the second metal 1710 is generally less suitable than a silicide of the first metal 1520 to be involved in electrical connections to the NFET fin 220, the second metal 1710 is only present in a small region 1720 disposed on the top surface of the NFET fin 220. Any performance penalty inflicted on the NFET fin 220 by the small region 1720 of the second metal 1710 is expected to be slight and more than compensated by greater efficiency and lower cost of formation of a semiconductor device 200 according to the present disclosure.

Figure 19:
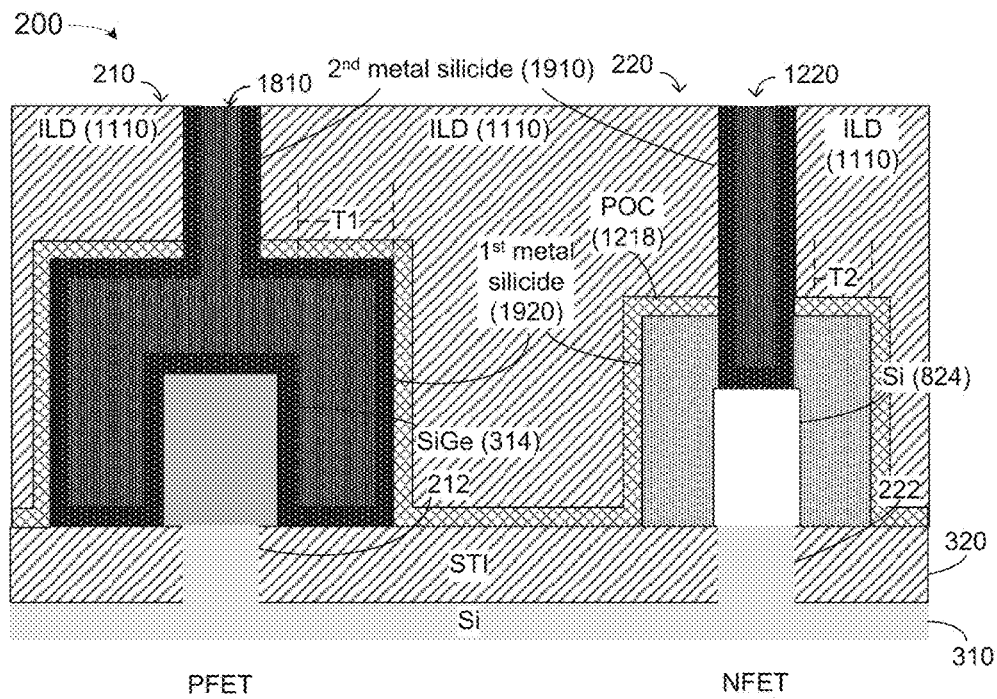
FIG. 19 illustrates a stylized X-cut cross-sectional view of the semiconductor device of FIG. 18, with respect to a anneal process, in accordance with embodiments herein.

FIG. 19 presents a stylized X-cut cross-sectional view of the semiconductor device 200 after a fill metal deposition process and an anneal process in accordance with embodiments herein. A fill metal 1810 is deposited to fill the first trench 1210, the second trench 1220, the first cavity 1310, and the second cavity 1320. The fill metal 1810 may be tungsten or any other metal known to the person of ordinary skill in the art to be suitable for forming contacts between a PFET fin 210 and an overlying conductive structure and between an NFET fin 220 and the same or a different overlying conductive structure. The fill metal 1810 may be deposited using any technique known to the person of ordinary skill in the art. Depositing the fill metal 1810 may involve overfilling the trenches 1210 and 1220, followed by CMP to planarize the fill metal 1810 to the top of the ILD 1110. Depositing the fill metal 1810 may involve exposing the semiconductor device 200, including the first metal 1520 and the second metal 1710, to relatively high temperatures, e.g., 500° C. or higher.

hereinafter depositon of the fill metal 1810, an anneal process may be performed. In the anneal process, the semiconductor device 200, including the first metal 1520 and the second metal 1710, is subjected to high temperatures, e.g., about 800° C. Anneal process conditions may be selected as a routine matter by the person of ordinary skill in the art having the benefit of the present disclosure. The anneal process (and, though typically to a lesser extent, exposing the semiconductor device 200 to relatively high temperatures during deposition of the fill metal 1810) allows silicidation of the first metal 1520 and the second metal 1710. In other words, silicon from silicon-containing layers or structures in proximity to the first metal 1520 and the second metal 1710 may react with the first metal 1520 and the second metal 1710, thereby converting the first metal 1520 and the second metal 1710 into a first metal silicide 1920 and a second metal silicide 1910, respectively.

Figure 20:
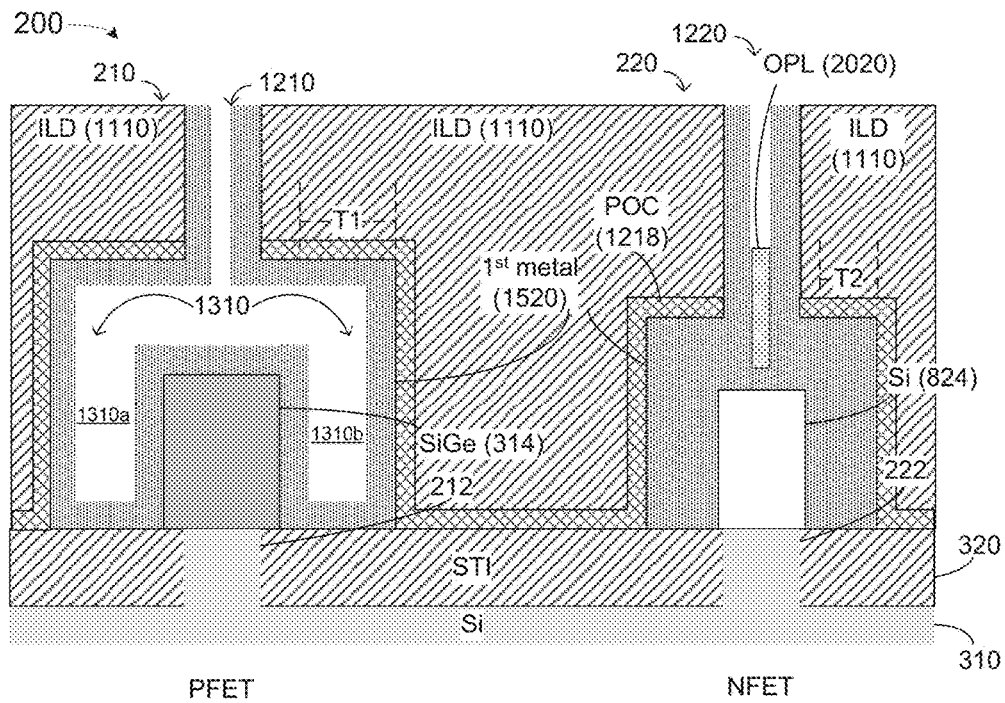
FIG. 20 illustrates a stylized X-cut cross-sectional view of the semiconductor device of FIG. 15, with respect to a masking process, in accordance with embodiments herein.

Turning to FIG. 20, a stylized X-cut cross-sectional view of the semiconductor device 200 from FIG. 16 after an organic polymerization layer (OPL) deposition process in accordance with embodiments herein is depicted. An OPL 2020 is deposited in the second trench 1220, thereby masking the first metal 1520 in the second cavity 1320. The OPL 2020 may be deposited to completely fill the second trench 1220, followed by recession to only partially fill the second trench 1220, as is shown in FIG. 20. Alternatively, the OPL 2020 may be deposited to only partially fill the second trench 1220 (thereby arriving at the embodiment depicted in FIG. 20), or the OPL 2020 may be deposited to completely fill the second trench 1220 (not shown). Any known OPL material may be used to form the OPL 2020. Techniques for depositing the OPL 2020 will be known to the person of ordinary skill in the art.

Figure 21:
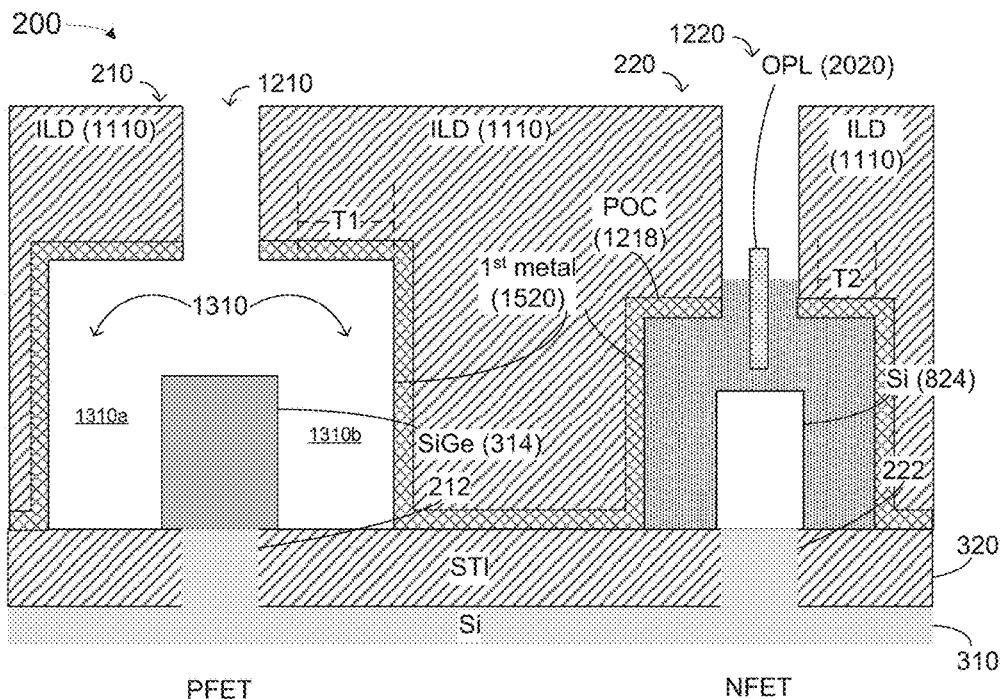
FIG. 21 illustrates a stylized X-cut cross-sectional view of the semiconductor device of FIG. 20, with respect to a first metal removal process, in accordance with embodiments herein.

FIG. 21 depicts a stylized X-cut cross-sectional view of the semiconductor device 200 after a first metal removal process in accordance with embodiments herein. The first metal 1520 may be removed by a first-step standard clean (SC1) process, such as an organic clean process and a particle clean process, although other known processes may be used, provided the process yields a structure substantially similar to that shown in FIG. 21, wherein the first metal 1520 is fully removed from the first trench 1210 and the first cavity 1310, is substantially removed from the second trench 1220, and is substantially retained in the second cavity 1320.

Figure 22:
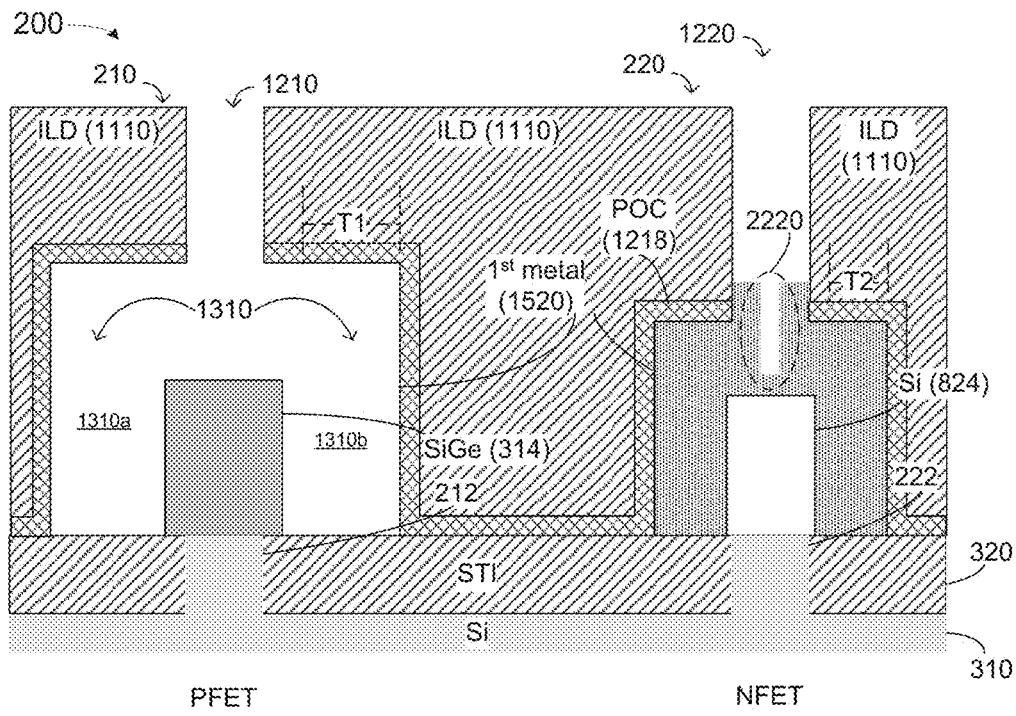
FIG. 22 illustrates a stylized X-cut cross-sectional view of the semiconductor device of FIG. 21, with respect to a mask removal process, in accordance with embodiments herein.

FIG. 22 depicts a stylized X-cut cross-sectional view of the semiconductor device 200 after an OPL removal process in accordance with embodiments herein. The OPL 2020 may be removed by ashing techniques known to the person of ordinary skill in the art. The ashing of an OPL in proximity to the first metal 1520, e.g., titanium, may lead to impaired properties of a first metal silicide and impair the function of an NFET fin 220 comprising the first metal silicide. However, only a small portion 2220 of the first metal 1520 is exposed to an ash of the OPL 2020. Any performance penalty inflicted on the NFET fin 220 by the small ash-exposed region 2220 is expected to be slight, and more than compensated by greater efficiency and lower cost of formation of a semiconductor device 200 according to the present disclosure.

Figure 23:
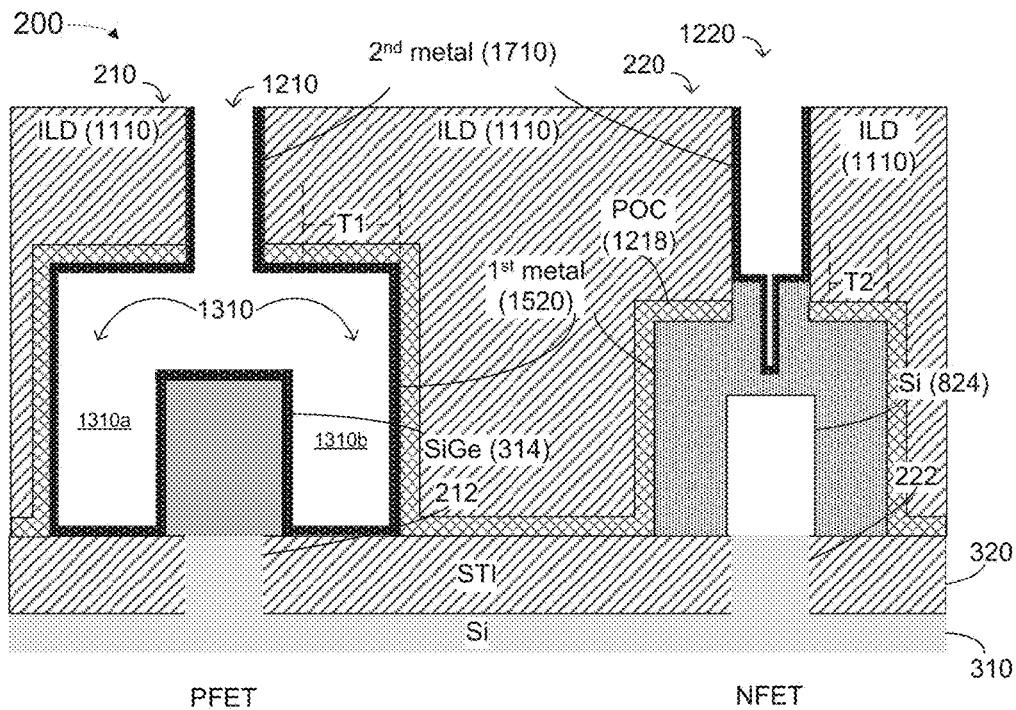
FIG. 23 illustrates a stylized X-cut cross-sectional view of the semiconductor device of FIG. 22, with respect to a second metal deposition process, in accordance with embodiments herein.

FIG. 23 depicts a stylized X-cut cross-sectional view of the semiconductor device 200 after a second metal deposition process in accordance with embodiments herein. The second metal 1710 is deposited on the walls of the first trench 1210, the walls of the second trench 1220, the surfaces of the first cavity 1310, and the surfaces of the second cavity 1320. The second metal 1710 may comprise nickel, nickel-platinum, or any other metal of which the silicide thereof is suitable for wrapping a S/D region of a PFET fin 210 in a final semiconductor device 200. The second metal 1710 may be deposited using any technique known to the person of ordinary skill in the art.

Figure 24:
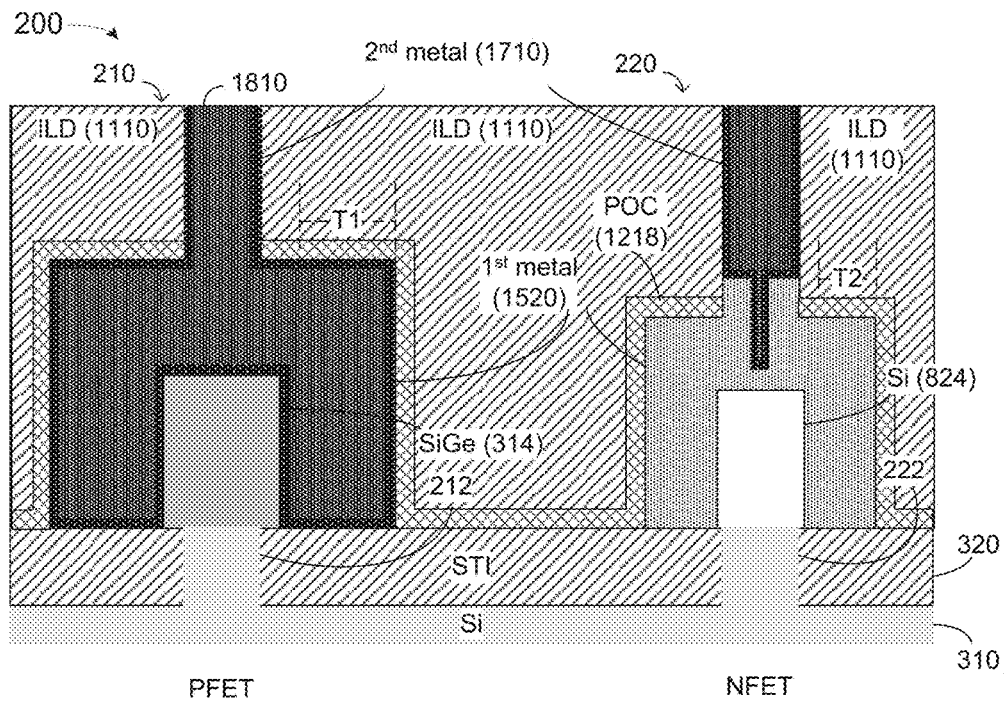
FIG. 24 illustrates a stylized X-cut cross-sectional view of the semiconductor device of FIG. 23, with respect to a fill metal deposition process, in accordance with embodiments herein.

FIG. 24 presents a stylized X-cut cross-sectional view of the semiconductor device 200 after a fill metal deposition process in accordance with embodiments herein. The fill metal 1810 is deposited to fill the first trench 1210, the second trench 1220, the first cavity 1310, and the second cavity 1320. The fill metal 1810 may be tungsten or any other metal known to the person of ordinary skill in the art to be suitable for forming contacts between a S/D region of a PFET fin 210 and an overlying conductive structure and between a S/D region of an NFET fin 220 and the same or a different overlying conductive structure. The fill metal 1810 may be deposited using any technique known to the person of ordinary skill in the art. Depositing the fill metal 1810 may involve overfilling the trenches 1210 and 1220, followed by CMP to planarize the fill metal 1810 to the top of the ILD 1110. Depositing the fill metal 1810 may involve exposing the semiconductor device 200, including the first metal 1520 and the second metal 1710, to relatively high temperatures, e.g., 500° C. or higher.

Figure 25:
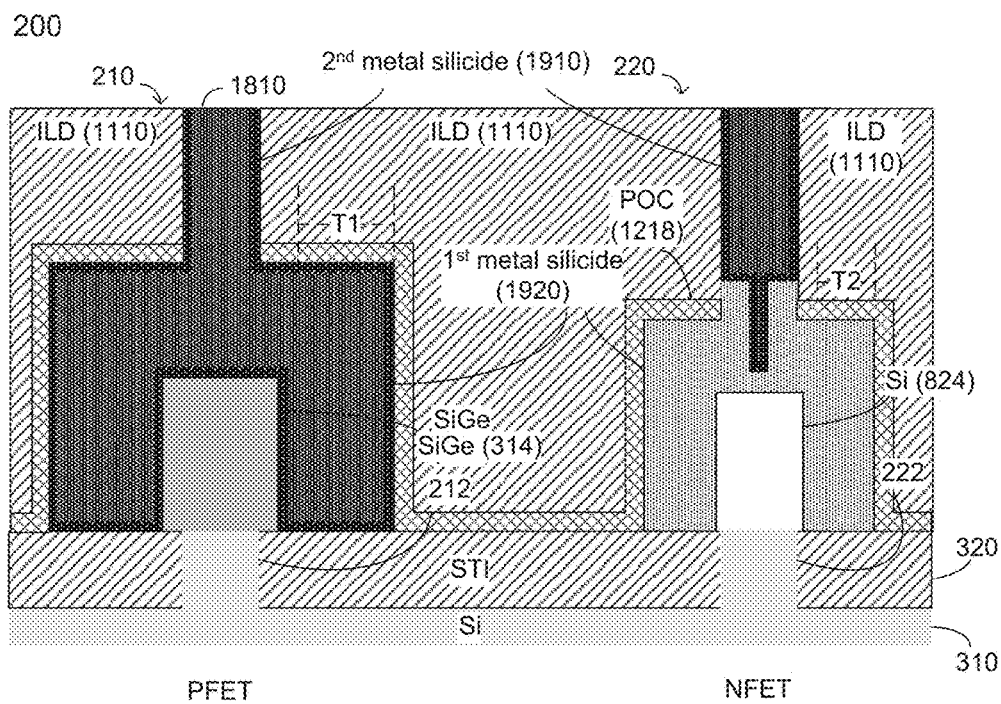
FIG. 25 illustrates a stylized X-cut cross-sectional view of the semiconductor device of FIG. 24, with respect to an anneal process, in accordance with embodiments herein.

FIG. 25 presents a stylized X-cut cross-sectional view of the semiconductor device 200 after an anneal process in accordance with embodiments herein. In the anneal process, the semiconductor device 200, including the first metal 1520 and the second metal 1710, is subjected to high temperatures, e.g., about 800° C. Anneal process conditions may be selected as a routine matter by the person of ordinary skill in the art having the benefit of the present disclosure. The anneal process (and, though typically to a lesser extent, exposing the semiconductor device 200 to relatively high temperatures during deposition of the fill metal 1810) allows silicidation of the first metal 1520 and the second metal 1710, thereby yielding the first metal silicide 1920 and the second metal silicide 1910, respectively.

Regardless whether the maskless process flow of FIGS. 3-19 or the masked process flow of FIGS. 3-16 and 20-25 is followed, a semiconductor device 200 formed according to embodiments herein may contain a PFET fin 210; an NFET fin 220; a first metal silicide 1920 around the NFET fin 220; a second metal silicide 1910 around the PFET fin 210; and a fill metal 1810 around the second metal silicide 1910, above the PFET fin 210, and above the NFET fin 220. In one embodiment, the PFET fin 210 may comprise epitaxial SiGe 314 over a body 212 of the fin. Alternatively or in addition, the NFET fin 220 may comprise epitaxial silicon 824 over a body 222 of the fin.

The semiconductor device 200 may further include an interlayer dielectric (ILD) 1110 around the fill metal 1810 above the PFET fin 210 and the NFET fin 220.

In the semiconductor device 200, the fill metal 1810 around the second metal silicide 1910 may be thicker than the first metal silicide 1920 around the NFET fin 220.

In the semiconductor device 200, the first metal silicide 1920 may be titanium silicide. Alternatively or in addition, the second metal silicide 1910 may be nickel silicide or nickel-platinum silicide.

Although FIGS. 3-25 show the PFET fin 210 and the NFET fin 220 as having rectangular cross-sectional areas, the PFET fin 210 and the NFET fin 220 may have other shapes, such as diamond shapes, merged diamond shapes, or other shapes known in the art. The parameters required to process such shapes may be determined as a routine matter by the person of ordinary skill in the art having the benefit of the present disclosure.

Figure 26:
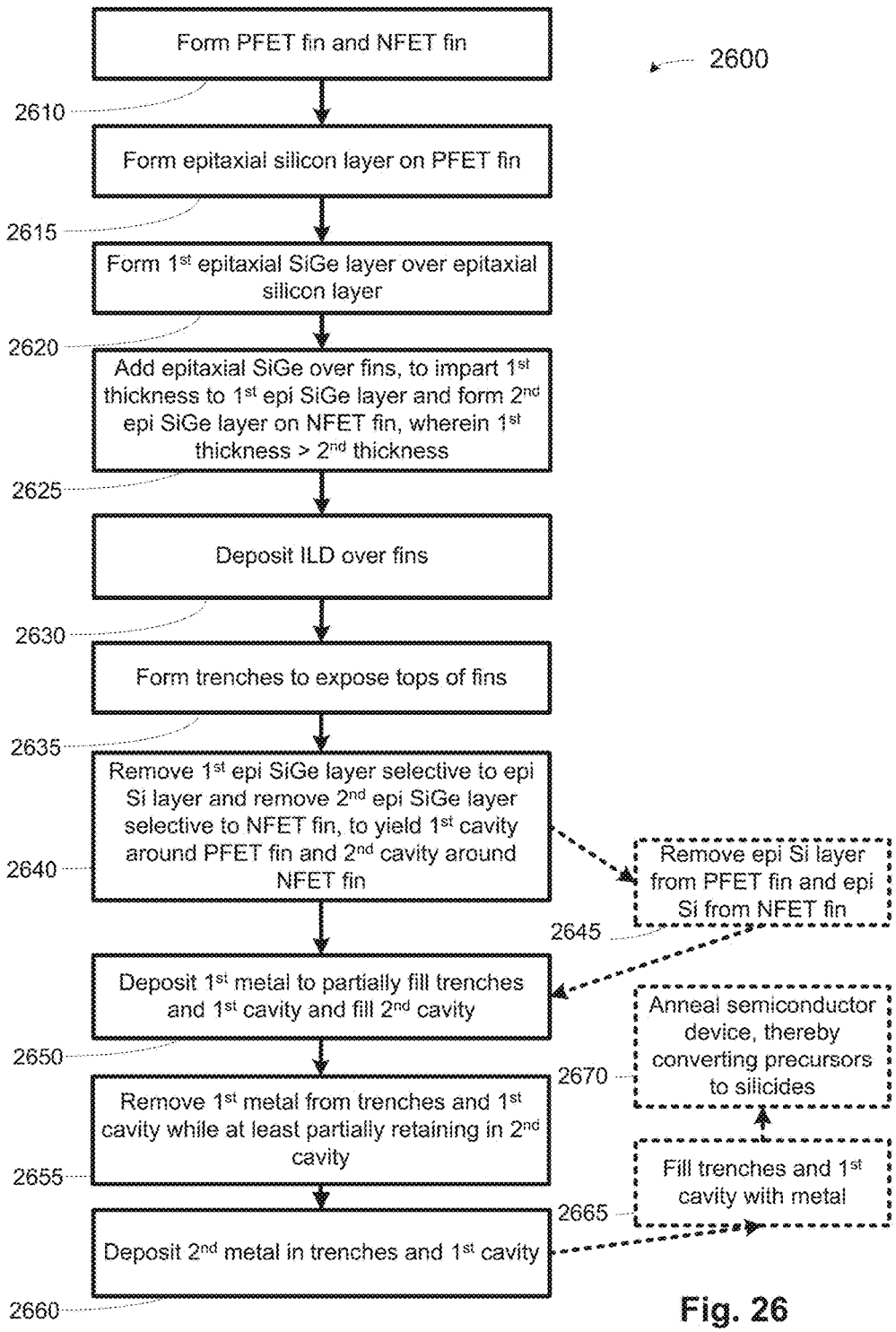
FIG. 26 illustrates a flowchart depiction of a method for forming a semiconductor device in accordance with embodiments herein.

Turning to FIG. 26, a flowchart depiction of a method 2600 for forming a semiconductor device in accordance with embodiments herein is illustrated. The method 2600 comprises forming (at 2610) a PFET fin and an NFET fin on a semiconductor device. In one embodiment, the PFET fin may comprise epitaxial SiGe over a body of the fin. Alternatively or in addition, the NFET fin may comprise epitaxial silicon over a body of the fin.

The method 2600 also comprises forming (at 2615) an epitaxial silicon layer on the PFET fin. The method 2600 additionally comprises forming (at 2620) a first epitaxial SiGe layer over the epitaxial silicon layer on the PFET fin. The method 2600 further comprises adding (at 2625) epitaxial SiGe over the PFET fin and the NFET fin, to impart to the first epitaxial SiGe layer a first thickness and to yield a second epitaxial SiGe layer having a second thickness on the NFET fin, wherein the first thickness is greater than the second thickness.

The method 2600 also comprises depositing (at 2630) an interlayer dielectric (ILD) over the PFET fin and the NFET fin, followed by forming (at 2635) a first trench in the ILD, to expose at least a portion of the first epitaxial SiGe layer on a top of the PFET fin, and a second trench in the ILD, to expose at least a portion of the second epitaxial SiGe layer on a top of the NFET fin. The method 2600 yet additionally comprises removing (at 2640) the first epitaxial SiGe layer selective to the epitaxial silicon layer on the PFET fin and the second epitaxial SiGe layer selective to the NFET fin, to yield a first cavity around the PFET fin and a second cavity around the NFET fin.

In one embodiment, the method 2600 may comprise removing (at 2645) the epitaxial silicon layer (from the PFET fin) and partially removing the epitaxial silicon from the NFET fin after removing the first epitaxial SiGe layer from the PFET fin.

The method 2600 also comprises depositing (at 2650) a first metal through the first trench and the second trench, to partially fill the first trench, the second trench, and the first cavity and to fill the second cavity. In one embodiment, the first metal is titanium. Subsequently, the method 2600 still further comprises removing (at 2655) the first metal from the first trench, the second trench, and the first cavity while at least partially retaining the first metal in the second cavity.

In one embodiment, the removing (at 2655) may involve isotropic removal of the first metal from the first trench, the second trench, and the first cavity. In another embodiment, the removing (at 2655) may involve forming a mask in the second trench prior to removing the first metal and removing the mask from the second trench after removing the first metal.

The method 2600 additionally comprises depositing (at 2660) a second metal in the first trench, the second trench, and the first cavity. In one embodiment, the second metal is nickel or nickel-platinum.

The method 2600 may further comprise filling (at 2665) the first trench, the second trench, and the first cavity with a metal. Additionally, the method 2600 may further comprise annealing the semiconductor device, thereby transforming the first metal to a first metal silicide and transforming the second metal to a second metal silicide.

Figure 27:
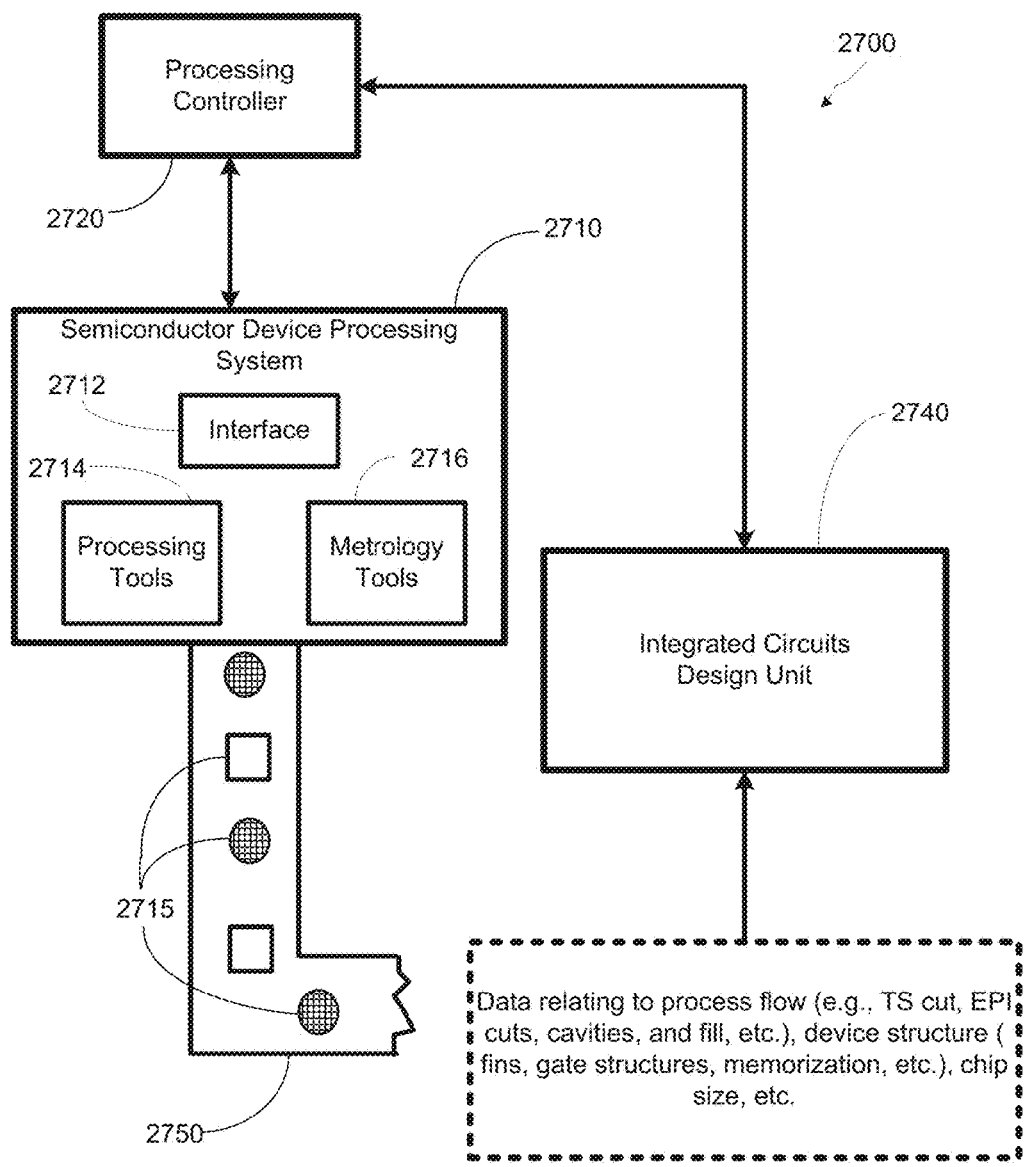
FIG. 27 illustrates a stylized depiction of a system for fabricating a semiconductor device in accordance with embodiments herein.

Turning now to FIG. 27, a stylized depiction of a system 2700 for fabricating a semiconductor device comprising an integrated circuit in accordance with embodiments herein is illustrated. The system 2700 provides for forming a first metal silicide around NFET fins, a second metal silicide around PFET fins, and a fill metal around the second metal silicide and above the PFET and NFET fins. The system 2700 of FIG. 27 may comprise a semiconductor device processing system 2710 and a design unit 2740. The semiconductor device processing system 2710 may manufacture integrated circuit devices based upon one or more designs provided by the design unit 2740.

The semiconductor device processing system 2710 may comprise various processing stations, such as etch process stations, photolithography process stations, CMP process stations, Epitaxy (EPI) process stations, etc. One or more of the processing steps performed by the processing system 2710 may be controlled by the processing controller 2720. The processing controller 2720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2710 may produce integrated circuits on a medium, such as silicon wafers. More particularly, the semiconductor device processing system 2710 produce semiconductor devices having PFET fins, NFET fins, first and second metal silicides, and fill metals as described above.

The production of integrated circuits by the device processing system 2710 may be based upon the circuit designs provided by the integrated circuits design unit 2740. The processing system 2710 may provide processed integrated circuits/devices 2715 on a transport mechanism 2750, such as a conveyor system. In some embodiments, the conveyor system may be sophisticated clean room transport systems that are capable of transporting semiconductor wafers. In one embodiment, the semiconductor device processing system 2710 may comprise a plurality of processing steps to form a semiconductor device having PFET fins, NFET fins, first and second metal silicides, and fill metals as described above.

In some embodiments, the items labeled "2715" may represent individual wafers, and in other embodiments, the items 2715 may represent a group of semiconductor wafers, e.g., a "lot" of semiconductor wafers. The integrated circuit or device 2715 may be a transistor, a capacitor, a resistor, a memory cell, a processor, and/or the like.

The integrated circuit design unit 2740 of the system 2700 is capable of providing a circuit design that may be manufactured by the semiconductor processing system 2710. The integrated circuit design unit 2740 may be capable of determining various features of the process flow (e.g., parameters of processes, whether or not various processes are performed, variations in the order of processes, etc.), the device structure (e.g., the number and location of processors, memory devices, etc.; the height, width, and shape of fins; the dimensions of first metal silicide structures, second metal silicide structures, fill metal structures, etc.). Based upon such details of the devices, the integrated circuit design unit 2740 may determine specifications of the finFETs that are to be manufactured. Based upon these specifications, the integrated circuit design unit 2740 may provide data for manufacturing a semiconductor device having the features provided by embodiments herein.

The system 2700 may be capable of performing analysis and manufacturing of various products involving various technologies. For example, the system 2700 may design and manufacture devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a PFET fin and an NFET fin on a semiconductor device;
   forming an epitaxial silicon layer on the PFET fin;
   forming a first epitaxial layer over the epitaxial silicon layer on the PFET fin;
   adding an epitaxial material over the PFET fin and the NFET fin, to impart to the first epitaxial layer a first thickness and to yield a second epitaxial layer having a second thickness on the NFET fin, wherein the first thickness is greater than the second thickness;
   depositing an interlayer dielectric (ILD) over the PFET fin and the NFET fin;
   forming a first trench in the ILD to a top of the PFET fin and a second trench in the ILD to a top of the NFET fin;
   removing the first epitaxial layer and the second epitaxial layer, to yield a first cavity around the PFET fin and a second cavity around the NFET fin, wherein the first cavity is wider than the second cavity;
   partially filling the first cavity and filling the second cavity with a first metal;
   removing the first metal from the first cavity; and
   depositing a second metal in the first cavity.

2. The method of claim 1, wherein:
   partially filling the first cavity and filling the second cavity with a first metal comprises partially filling the first cavity and filling the second cavity with titanium;
   forming the first epitaxial layer comprises forming a first epitaxial SiGe layer;
   forming the second epitaxial layer comprises forming a second epitaxial SiGe layer; and
   adding the epitaxial material over the PFET fin and an NFET fin comprises adding an epitaxial SiGe material over the PFET fin and the NFET fin.

3. The method of claim 1, wherein depositing the second metal into the first cavity comprises depositing at least one of nickel or nickel-platinum.

4. The method of claim 1, wherein the removing the first metal comprises isotropic removal of the first metal from the first cavity.

5. The method of claim 1, wherein the removing the first metal comprises forming a mask above the second cavity prior to removing the first metal and removing the mask from above the second cavity after removing the first metal.

6. The method of claim 1, wherein forming the PFET fin comprises forming a PFET fin that comprises an epitaxial SiGe over a body of the fin and on which the epitaxial silicon layer is formed, and forming the NFET fin comprises forming an NFET fin that comprises an epitaxial silicon over a body of the fin and on which the second epitaxial SiGe layer is formed.

7. The method of claim 6, further comprising removing the epitaxial silicon layer and partially removing the epitaxial silicon from the NFET fin after removing the first epitaxial SiGe layer.

8. The method of claim 1, further comprising filling the first cavity with a fill metal.

9. The method of claim 1, further comprising annealing the semiconductor device, thereby transforming the first metal to a first metal silicide and transforming the second metal to a second metal silicide.

10. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
form a PFET fin and an NFET fin on a semiconductor device;
form an epitaxial silicon layer on the PFET fin;
form a first epitaxial layer over the epitaxial silicon layer on the PFET fin;
add an epitaxial material over the PFET fin and the NFET fin, to impart to the first epitaxial layer a first thickness and to yield a second epitaxial layer having a second thickness on the NFET fin, wherein the first thickness is greater than the second thickness;
deposit an interlayer dielectric (ILD) over the PFET fin and the NFET fin;
form a first trench in the ILD to a top of the PFET fin, and a second trench in the ILD, to a top of the NFET fin;
remove the first epitaxial layer and the second epitaxial layer, to yield a first cavity around the PFET fin and a second cavity around the NFET fin, wherein the first cavity is wider than the second cavity;
partially fill the first cavity and fill the second cavity;
remove the first metal from the first cavity; and
deposit a second metal in the first cavity.

11. The system of claim 10, wherein the semiconductor device processing system is adapted to deposit titanium as the first metal, to deposit nickel or nickel-platinum as the second metal, or both.

12. The system of claim 10, wherein the semiconductor device processing system is adapted to remove the first metal by isotropic removal of the first metal from the first cavity.

13. The system of claim 10, wherein the semiconductor device processing system is adapted to remove the first metal by forming a mask above the second cavity prior to removing the first metal and removing the mask from above the second cavity after removing the first metal.

14. The system of claim 10, wherein the semiconductor device processing system is further adapted to fill the first trench, the second trench, and the first cavity with a fill metal.

15. The system of claim 10, wherein the semiconductor device processing system is further adapted to anneal the semiconductor device, thereby transforming the first metal to a first metal silicide and transforming the second metal to a second metal silicide.

* * * * *